(12) United States Patent
Brown et al.

(10) Patent No.: US 7,480,129 B2
(45) Date of Patent: Jan. 20, 2009

(54) DETACHABLE ELECTROSTATIC CHUCK FOR SUPPORTING A SUBSTRATE IN A PROCESS CHAMBER

(75) Inventors: Karl Brown, Mountain View, CA (US); Semyon Sherstinsky, San Francisco, CA (US); Wei W. Wang, Santa Clara, CA (US); Cheng-Hsiung Tsai, Cupertino, CA (US); Vineet Mehta, Sunnyvale, CA (US); Allen Lau, Cupertino, CA (US); Steve Sansoni, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 40 days.

(21) Appl. No.: 11/221,169

(22) Filed: Sep. 7, 2005

(65) Prior Publication Data

US 2006/0002053 A1  Jan. 5, 2006

Related U.S. Application Data

(63) Continuation-in-part of application No. 10/816,152, filed on Mar. 31, 2004.

(51) Int. Cl.
*H01L 21/683* (2006.01)
(52) U.S. Cl. .................................. 361/234; 451/296
(58) Field of Classification Search ................. 361/234; 451/296
See application file for complete search history.

(56) References Cited

U.S. PATENT DOCUMENTS

| | | | |
|---|---|---|---|
| 3,586,343 A * | 6/1971 | Reed ........................... 409/232 |
| 4,645,218 A | 2/1987 | Ooshio et al. |
| 4,902,025 A * | 2/1990 | Zimdars ....................... 279/64 |
| 5,155,652 A | 10/1992 | Logan et al. |
| 5,191,506 A | 3/1993 | Logan et al. |
| 5,213,349 A * | 5/1993 | Elliott ......................... 279/128 |
| 5,280,156 A | 1/1994 | Niori et al. |

(Continued)

FOREIGN PATENT DOCUMENTS

JP  09045757 A  2/1997

(Continued)

OTHER PUBLICATIONS

U.S. Patent Application entitled, "Detachable Ecltrostatic Chuck"; filed Mar. 31, 2004; U.S. Appl. No. 10/816,152; Inventors: Brown, et al.

(Continued)

*Primary Examiner*—Michael J Sherry
*Assistant Examiner*—Zeev Kitov
(74) *Attorney, Agent, or Firm*—Janah & Associates, P.C.

(57) ABSTRACT

A detachable electrostatic chuck can be attached to a pedestal in a process chamber. The electrostatic chuck has an electrostatic puck comprising a dielectric covering at least one electrode and a frontside surface to receive a substrate. A backside surface of the chuck has a central protrusion that can be a D-shaped mesa to facilitate alignment with a mating cavity in the pedestal. The protrusion can also have asymmetrically offset apertures, which further assist alignment, and also serve to receive electrode terminal posts and a gas tube. A heat transfer plate having an embedded heat transfer fluid channel is spring loaded on the pedestal to press against the chuck for good heat transfer.

31 Claims, 6 Drawing Sheets

U.S. PATENT DOCUMENTS

| | | | |
|---|---|---|---|
| 5,376,213 | A | 12/1994 | Ueda et al. |
| 5,460,684 | A | 10/1995 | Saeki et al. |
| 5,478,429 | A | 12/1995 | Komino et al. |
| 5,527,584 | A | 6/1996 | Darfler et al. |
| 5,529,657 | A | 6/1996 | Ishii |
| 5,581,874 | A | 12/1996 | Aoki et al. |
| 5,600,530 | A | 2/1997 | Smith |
| 5,606,484 | A | 2/1997 | Kawada et al. |
| 5,625,526 | A | 4/1997 | Watanabe et al. |
| 5,665,260 | A | 9/1997 | Kawada et al. |
| 5,671,116 | A | 9/1997 | Husain |
| 5,737,178 | A | 4/1998 | Herchen |
| 5,745,331 | A | 4/1998 | Shamouilian et al. |
| 5,818,693 | A | 10/1998 | Garner et al. |
| 5,827,585 | A | 10/1998 | Giannetti |
| 5,858,100 | A | 1/1999 | Maeda et al. |
| 5,870,100 | A | 2/1999 | DeFreitas |
| 5,879,100 | A * | 3/1999 | Winkler ............... 403/325 |
| 5,886,863 | A | 3/1999 | Nagasaki et al. |
| 5,886,864 | A | 3/1999 | Dvorsky |
| 5,906,684 | A * | 5/1999 | Tamura et al. ............ 118/728 |
| 5,949,650 | A | 9/1999 | Bulante et al. |
| 5,958,813 | A | 9/1999 | Aida et al. |
| 5,978,202 | A | 11/1999 | Wadensweiler et al. |
| 5,994,662 | A * | 11/1999 | Murugesh ............. 219/121.43 |
| 6,034,863 | A | 3/2000 | Marohl et al. |
| 6,048,434 | A | 4/2000 | Tamura et al. |
| 6,072,685 | A | 6/2000 | Herchen et al. |
| 6,081,414 | A * | 6/2000 | Flanigan et al. ............ 361/234 |
| 6,094,334 | A | 7/2000 | Bedi et al. |
| 6,108,189 | A * | 8/2000 | Weldon et al. ............ 361/234 |
| 6,120,661 | A | 9/2000 | Hirano et al. |
| 6,159,055 | A | 12/2000 | Satitpunwaycha et al. |
| 6,215,641 | B1 * | 4/2001 | Busse et al. ............... 361/234 |
| 6,219,219 | B1 | 4/2001 | Hausmann et al. |
| 6,310,755 | B1 * | 10/2001 | Kholodenko et al. ....... 361/234 |
| 6,490,144 | B1 | 12/2002 | Narendrnath et al. |
| 6,503,131 | B1 * | 1/2003 | Franklin et al. ............ 451/296 |
| 6,503,572 | B1 | 1/2003 | Waggoner et al. |
| 6,538,872 | B1 | 3/2003 | Wang et al. |
| 6,563,686 | B2 | 5/2003 | Tsai et al. |
| 6,646,233 | B2 * | 11/2003 | Kanno et al. ................ 219/390 |
| 6,700,099 | B2 | 3/2004 | Cole et al. |
| 6,740,853 | B1 * | 5/2004 | Johnson et al. .......... 219/444.1 |
| 6,853,533 | B2 | 2/2005 | Parkhe ...................... 361/234 |
| 6,907,924 | B2 * | 6/2005 | Moslehi ...................... 165/275 |
| 6,918,530 | B2 * | 7/2005 | Shinkai et al. ........... 228/122.1 |
| 2002/0036881 | A1 | 3/2002 | Shamouilian et al. ....... 361/234 |
| 2002/0050246 | A1 | 5/2002 | Parkhe et al. |
| 2002/0081445 | A1 | 6/2002 | Kadomura et al. |
| 2005/0219786 | A1 | 10/2005 | Brown et al. |

FOREIGN PATENT DOCUMENTS

| | | |
|---|---|---|
| JP | 10270540 A | 10/1998 |
| JP | 11163109 A | 6/1999 |
| JP | 11176919 A | 7/1999 |

OTHER PUBLICATIONS

M Cubed Technologies, Inc., "Beams and Structural Members", Beam Note, Rev. 03, Jul. 25, 2001, retrieved at Internet address www.mmmt.com/Beam.pdf.

M Cubed Technologies, Inc., "Si Wafer Chucks", retrieved at Internet address www.mmmt.com/chuck.pdf.

M Cubed Technologies, Inc., "Overview of M Cubed Technologies' Materials Processes", Materials Overview, Rev. 02, 080403, retrieved at Internet address www.mmmt.com/Technotes/MaterialsOverview.pdf.

M Cubed Technologies, Inc., "Preform Infiltrated Silicon Carbide Particulate-Reinforced Aluminum (AlSiC) Metal Matrix Composites", Infiltrated MMC, Rev. 01, Nov. 2, 1999, retrived at Internet address www.mmmt.com/Technotes/InfilMMCNote.pdf.

M Cubed Technologies, Inc., "Cast Silicon Carbide Particulate-Reinforced Aluminum (Al/SiC) Metal Matrix Composites", Cast MMC, Rev. 02, May 8, 2001, retrived at Internet address www.mmmt.com/Technotes/CastMMCNote.pdf.

M Cubed Technologies, Inc., "Reaction Bonded Silicon Carbide Ceramics", Reaction Bonded SiC, Rev. 02, Nov. 18, 1999, retrieved at Internet address www.mmmt.com/Technotes/SiCNote.pdf.

M Cubed Technologies, Inc., "Aluminum-Toughened SiC Ceramic", Al-Toughened SiC, Rev. 05, Aug. 4, 2003, retrieved at Internet address www.mmmt.com/Technotes/ToughenedSiCNote.pdf.

Karandikar et al, "Complex, net-shape ceramic composite components for structural, lithography, mirror and armor applications", Presented at the 27th Annual Cocoa Beach Conference and Exposition, Cocoa Beach, FL, 2003 by M Cubed Technologies, Inc., retrieved at Internet address www.mmmt.com/Publications/MCubedCocoaBeach03.pdf.

IBM Technical Disclosure Bulletin, vol. 31, No. 1, Jun. 1988, pp. 462-464.

* cited by examiner

DETACHABLE ELECTROSTATIC CHUCK FOR SUPPORTING A SUBSTRATE IN A PROCESS CHAMBER

CROSS REFERENCE

The present application is a continuation-in-part of U.S. patent application Ser. No. 10/816,152, filed on Mar. 31, 2004, which is herein incorporated by reference in its entirety.

BACKGROUND

Embodiments of the present invention relate to a support electrostatic chuck for holding a substrate in a process chamber.

In the processing of substrates, such as semiconducting wafers and displays, a substrate is placed on a substrate support in a process chamber. The support can include an electrostatic chuck having electrodes capable of being electrically biased to hold the substrate on the support. The electrodes may also be powered with high frequency electrical power to energize a process gas in the chamber to process the substrate. The support can also comprise a support post and pedestal that supports the electrostatic chuck in the chamber, and may be capable of raising or lowering the height of the chuck and substrate. The support post and pedestal can also provide a protective enclosure for connecting wires, gas tubes etc, that connect to portions of the support.

In a typical chamber process, the energized process gas is used to process a substrate by, for example, etching or depositing material on the substrate or to clean surfaces in the chamber. The energized gas can have highly corrosive species which etch away exposed portions of the support, as well as ionic and radical species energized with kinetic energy which bombard the exposed support portions to erode them. The eroded support is typically replaced after a number of process cycles and before it provides inconsistent or undesirable electrical properties for holding substrates or for generating the plasma. Also, particles eroded away from the support can contaminate substrates being held on the support and so such erosion is undesirable.

Substrate supports, which provide better resistance to erosion by the energized gas, include electrostatic chucks made of ceramics, such as aluminum nitride, which have an embedded electrode. The ceramic chuck is brazed to an underlying stainless steel pedestal, as described for example in commonly assigned U.S. Pat. No. 6,563,686 to Tsai et al. and U.S. Pat. No. 6,853,533 to Parkhe, both of which are herein incorporated by reference in their entireties. Ceramic chucks provide improved resistance to corrosion by energized process gases and maintain their structural integrity at high temperatures.

However, one problem with ceramic chucks arises due to the thermal expansion mismatch between the ceramic and the supporting pedestal which is typically made from metal, especially at high processing temperatures. The difference in thermal expansion coefficients result in thermal and mechanical stresses, which can cause the ceramic to fracture or chip. One solution to this problem is described in commonly assigned U.S. Patent Publication No. 2002/0036881 to Shamouilian et al, filed on May 7, 1999, now abandoned, which is also herein incorporated by reference in its entirety. The support described by Shamouilian et al. has a ceramic electrostatic member having an electrode that is joined to a base beneath the electrostatic member. The base is made of a composite of a ceramic and a metal, which has a coefficient of thermal expansion that is sufficiently close to that of the ceramic e-chuck to reduce thermal expansion stresses. The ceramic e-chuck and base are typically brazed together to provide a strong bond between them. The base in turn is joined to an underlying support via a metal bond.

However, such substrate supports still get eroded with time in the chamber and replacement of the entire e-chuck electrostatic chuck is costly. The entire e-chuck electrostatic chuck has to be replaced because its component parts are integrally attached to one another. Also, when replacing the e-chuck electrostatic chuck, the operator often damages the electrostatic chuck or portions of the electrostatic chuck due to improper alignment of the e-chuck electrostatic chuck with various connectors and tubing in the chamber. Improper connections can also result in subsequent processing problems, for example, the helium gas supplied to the e-chuck electrostatic chuck can also leak out if the helium gas tubes and junction holes are improperly aligned.

Thus, it is desirable to have a substrate support that exhibits reduced thermal expansion mismatch and is tolerant to erosion in the chamber environment. It is also desirable to be able to easily replace the substrate support and at lower costs. It is further desirable not to have to replace the entire electrostatic chuck as frequently as necessary with conventional supports. It is also desirable to have a support that can be replaced without damaging components or portions of the electrostatic chuck.

SUMMARY

An electrostatic chuck is provided for attachment to a pedestal in a substrate processing chamber. The electrostatic chuck has at least one electrode, a dielectric covering the electrode, and a frontside surface to receive a substrate. The electrostatic chuck also has an annular flange. A backside surface of the chuck comprises a central protrusion having asymmetrical or nonsymmetrically offset orifices for receiving electrode terminal posts and a gas tube.

In another version, the electrostatic chuck comprises at least one electrode, a dielectric covering the electrode and a frontside surface to receive a substrate. An annular flange extends about the dielectric. A backside surface of the chuck comprises a D-shape mesa surrounded by an annular trough.

In another version, a substrate support for a substrate-processing chamber comprises an electrostatic chuck for attachment to a pedestal in a substrate-processing chamber. The chuck comprises an electrostatic puck having a dielectric covering at least one electrode and a frontside surface to receive a substrate. The chuck further comprises a base plate attached to the electrostatic puck, the base plate comprising a composite of porous ceramic and infiltrated metal, having an annular flange, and a backside surface comprising a central protrusion that is a D-shaped mesa which has non-symmetrically offset orifices for receiving electrode terminal posts and a gas tube. A pedestal having a peripheral ledge can be attached to the annular flange of the base plate of the electrostatic chuck.

Another version of the substrate support comprises an electrostatic chuck having a dielectric covering at least one electrode, a frontside surface to receive a 5 substrate, and a backside surface having an annular flange extending beyond the periphery of the dielectric. A pedestal has a peripheral ledge to attach to the annular flange of the electrostatic chuck. A spring loaded heat transfer plate is provided on the pedestal to contact the electrostatic chuck, the heat transfer plate comprising a fluid channel.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1A:
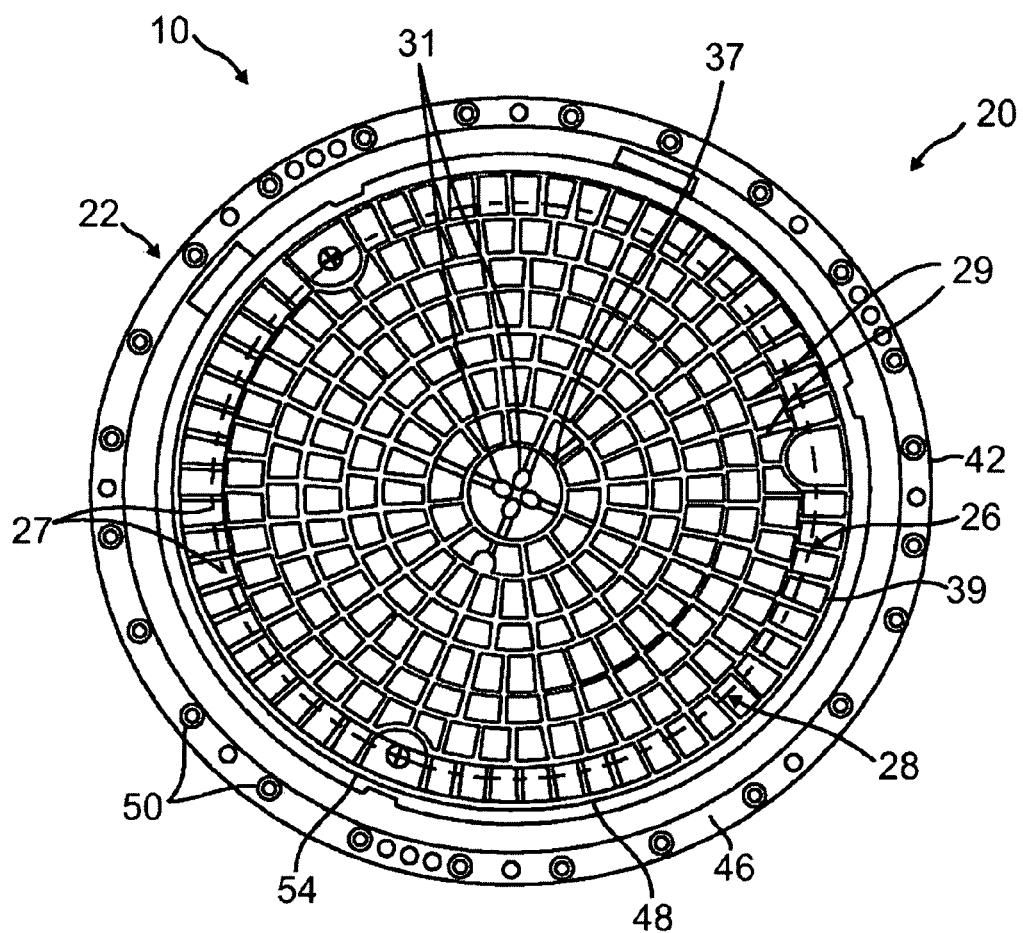
FIG. 1A is a top plan view of an embodiment of an electrostatic chuck having a frontside surface which receives a substrate.
Figure 1B:
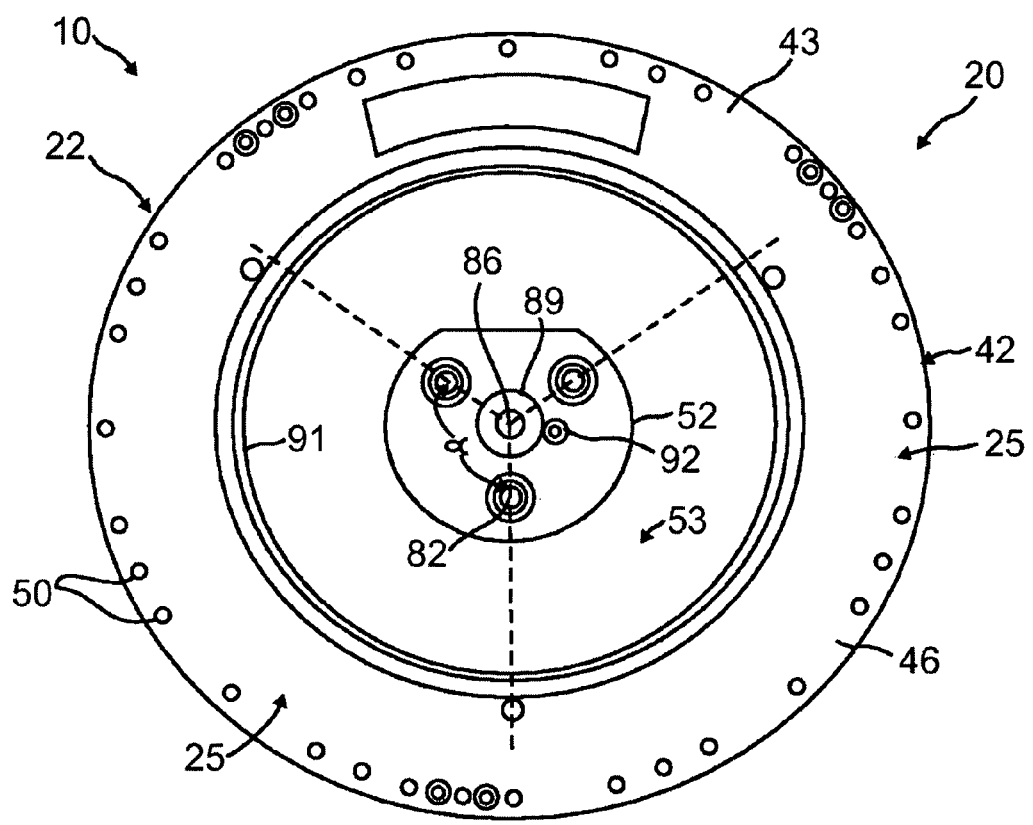
FIG. 1B is a bottom plan view of the electrostatic chuck of FIG. 1A showing a backside surface having a raised central protrusion surrounded by an annular trough.
Figure 2:
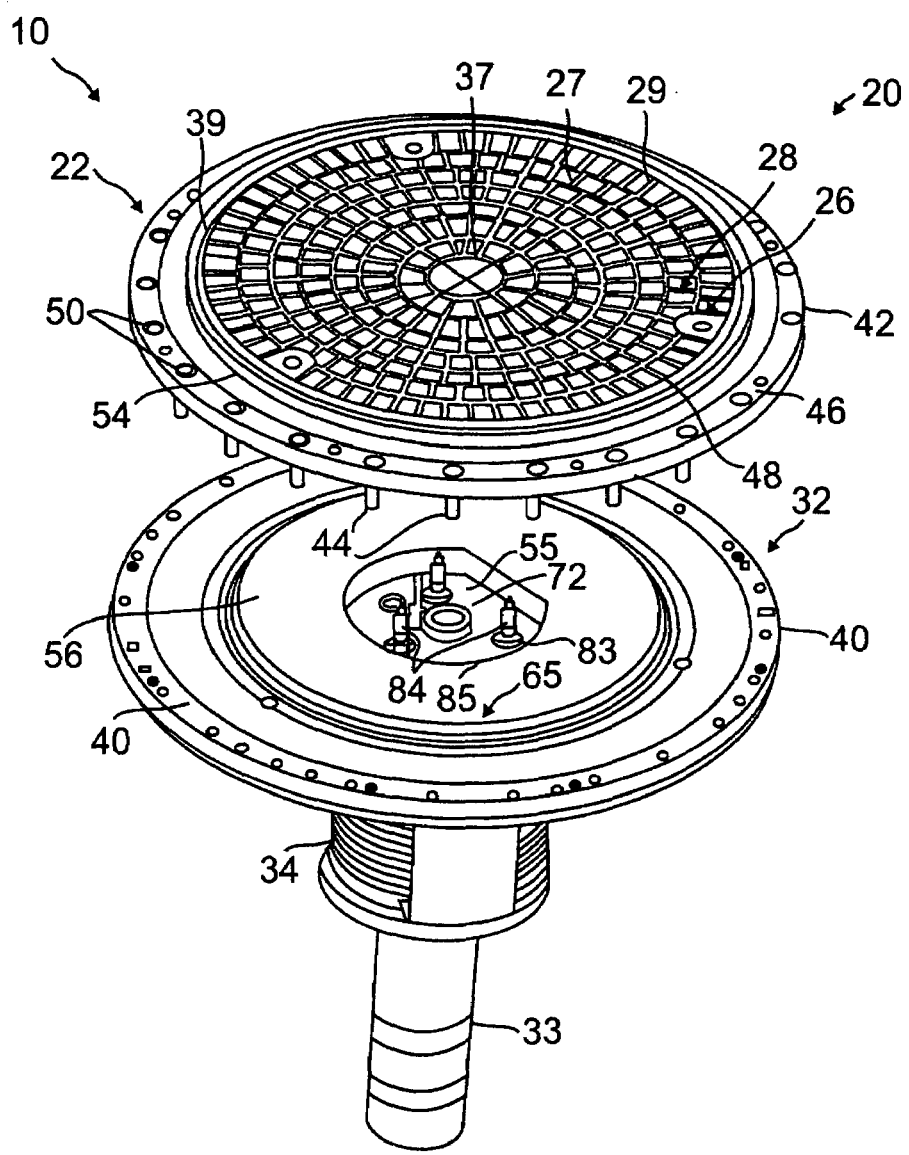
FIG. 2 is a perspective exploded view of a substrate support comprising the electrostatic chuck of FIG. 1A aligned to a pedestal.
Figure 3:
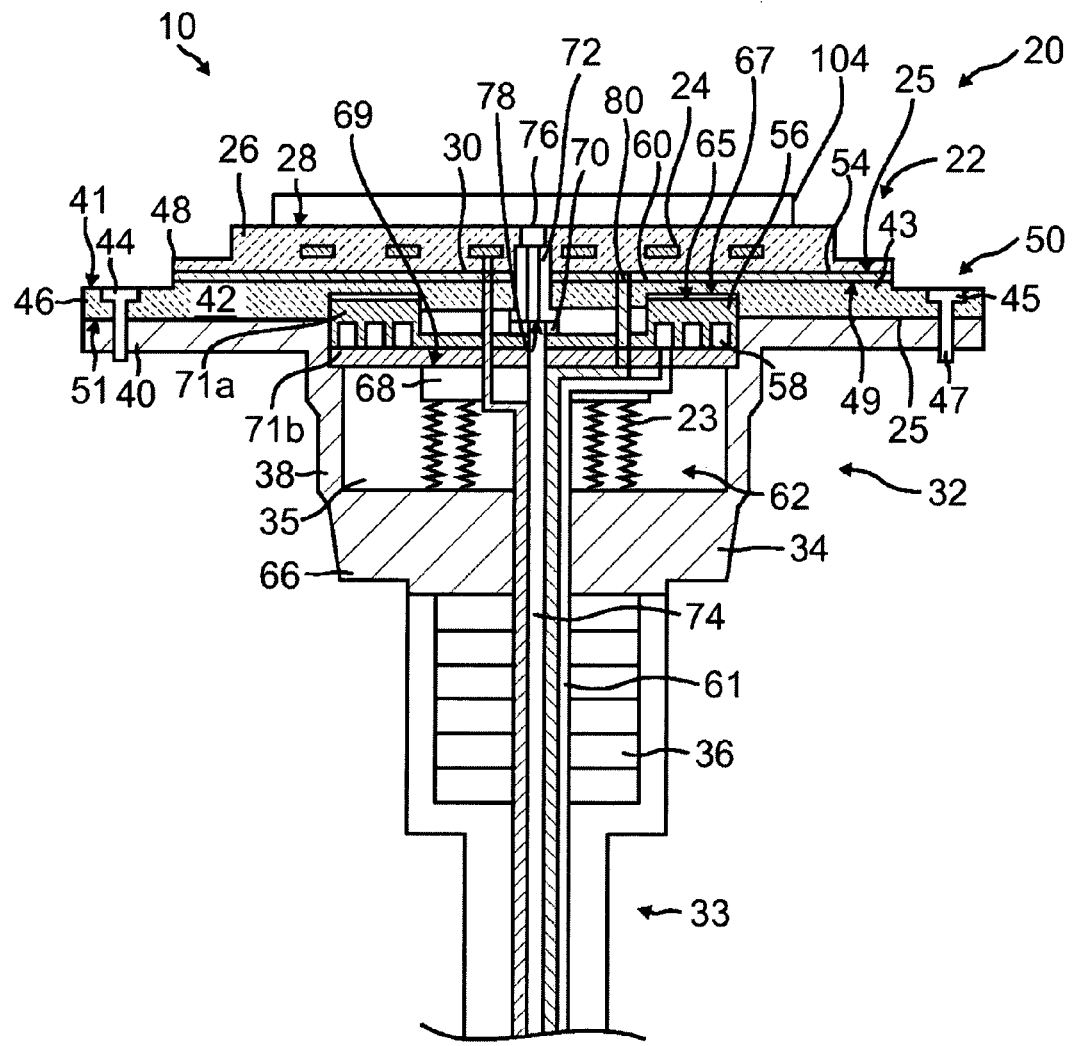
FIG. 3 is a sectional side view of the substrate support of FIG. 2 showing the base plate with the annular flange attached to a peripheral ledge of the pedestal.
Figure 4:
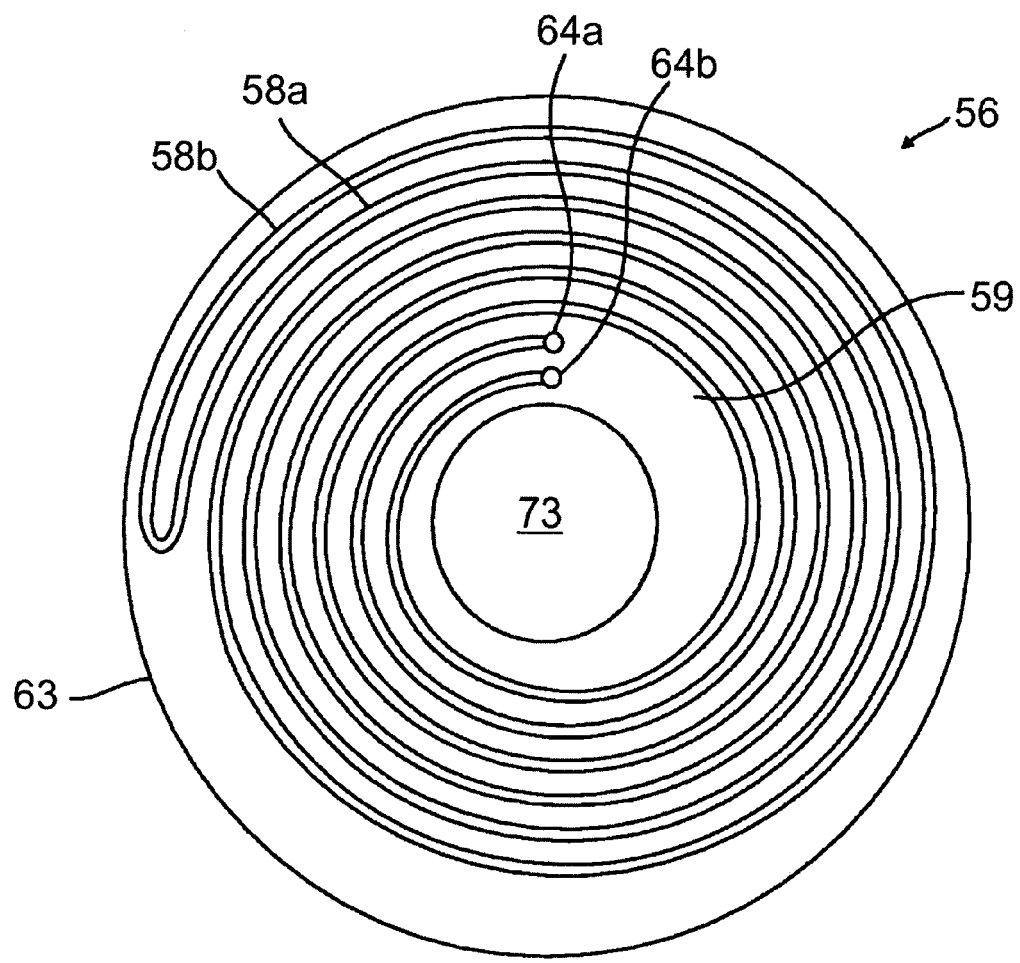
FIG. 4 is a sectional top view of an embodiment of a heat transfer plate having a fluid channel.

A substrate support 10 adapted to hold a substrate 104 in a substrate processing chamber 106, as shown for example in FIGS. 1 to 5, comprises an electrostatic chuck 20 and a pedestal 32. The electrostatic chuck 20 comprises an electrostatic puck 22 having a chargeable electrode 24 (FIG. 3). Referring to FIG. 1A, the electrostatic puck 22 comprises a disc-like shape having an annular periphery 48 that matches the shape and size of the substrate it is used to support. The puck 22 comprises a dielectric 26 that at least partially covers the electrode 24 and which can even have an embedded electrode 24. The dielectric 26 desirably comprises a material permeable to electromagnetic energy, such as for example, at least one of aluminum nitride, aluminum oxide, and titanium oxide, and preferably comprises aluminum nitride. The dielectric 26 can, however, also comprise other layers such as polymer layers for example, polyimide. The dielectric 26 comprises a frontside surface 28 that serves to receive a substrate 104 on the electrostatic chuck 20. In the version shown in FIG. 1A, the frontside surface 28 comprises a plurality of raised wedge shaped mesas 27 which are formed by intersecting gas grooves 29. The gas grooves 29 are provided to hold a heat transfer gas such as helium or argon, which is supplied through the gas ports 31 on the surface 28. The gas grooves 29 are radial lines that are spread apart from one another by from about 5 about 10°, and terminate in an inner circular groove 37 and an outer circular groove 39. While one version of the electrostatic chuck 20 is illustrated herein, it should be understood that other versions can also be used, and the present invention should not be limited to the exemplary versions illustrated herein.

Figure 5:
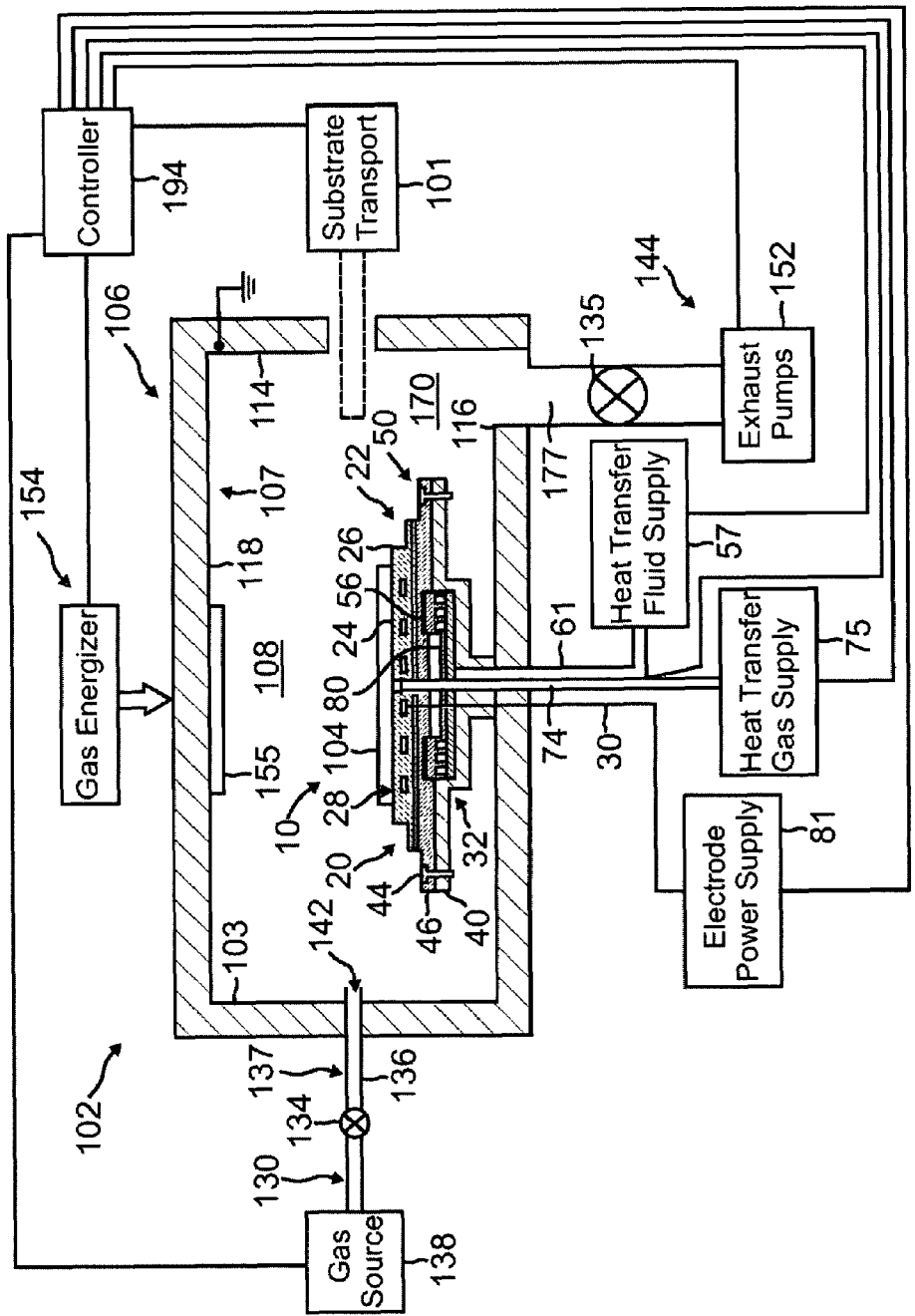
FIG. 5 is a partial sectional schematic side view of an embodiment of a process chamber having a substrate support according to an embodiment of the invention.

The electrode 24 of the chuck 20 is capable of being electrically biased to electrostatically hold the substrate 104 on the surface 28. For example, the electrode 24 can be connected via one or more electrical connectors 30, as shown in FIG. 3, to an electrode power supply 81 that delivers a DC chucking voltage (FIG. 5). The electrode 24 can be a monopolar electrode, or for non-plasma process, a bipolar electrode with two sides that are each maintained at a different voltage to generate an electrostatic charge in the substrate 104, which clamps it to the chuck. The electrode 24 may also be capable of being electrically biased to energize a process gas in the chamber to process the substrate 104 or clean the chamber 106. For example, the electrode power supply 81 may be capable of providing a high frequency voltage, such as a radio frequency voltage (RF) to the electrode 24 to capacitively couple energy to a process gas. Typically the electrode 24 comprises a metal, such as a wire grid embedded in the dielectric 26, or it can be a metal plate covered by the dielectric. The metal can be stainless steel, aluminum, copper or even high temperature metals such as molybdenum or tungsten. In the version shown the electrode 24 is a metal wire grid of molybdenum.

Referring to FIG. 1B, the electrostatic chuck 20 further comprises a base plate 42 below the electrostatic puck 22 that is used to attach the electrostatic puck 22 to a pedestal 32 in the chamber. The base plate 42 comprises a disc-like main portion 43 underneath the dielectric 24, and an annular flange 46 that extends outwardly from the main portion 43 and is positioned over a peripheral ledge 40 of the pedestal 32. The annular flange 46 extends beyond the periphery 48 of the dielectric 26 to provide an exposed base plate portion that is uncovered by the dielectric 26, and that can be attached to the pedestal 32. To connect the base plate 42 to the pedestal 32, the annular flange 46 comprises a plurality of holes 50 that are sized and shaped to allow a connector 44 to pass therethrough to connect to the pedestal ledge 40 (FIG. 2). For example, the holes 50 may extend vertically through a thickness of the annular flange 46, from a flange upper surface 41 to a flange lower surface 43. The holes 50 can also extend through at least a portion of the pedestal ledge 40 to secure the flange 46 to the ledge 40. A connector 44 suitable to connect the base plate 42 to the ledge 40 via the holes 50 can comprise, for example, at least one of a pin, bracket, bolt, screw, nail, and other similar object. For example, the connector 44 may comprise a threaded pin having a head 45 that is held on the top surface 41 of the annular flange 46, and a threaded lower end 47 that fits with a threaded hole 50 formed in the ledge 40 to secure the base plate 42 and pedestal 32 together. The base plate 42 desirably comprises a material that is sufficiently strong to allow it to be easily machined to shape and which can be secured to the pedestal 32 via the holes 50 substantially without cracking or breaking.

In one version, the base plate 42 comprises a material having thermal properties that are suitably matched to the overlying dielectric 26. For example, the base plate 42 can comprise a composite of ceramic and metal, which provides better strength and durability than ceramic alone and also has good heat transfer properties. The composite material has a thermal expansion coefficient that is matched to the dielectric 26 to reduce thermal expansion mismatch. In one version, the composite material comprises a ceramic having pores that are infiltrated with a metal, which at least partially fills the pores to form a composite material. The ceramic may comprise, for example, at least one of silicon carbide, aluminum nitride, aluminum oxide or cordierite, and is preferably silicon carbide. The ceramic may comprise a pore volume of from about 20 to about 80 volume % of the total volume, the remainder volume being of the infiltrated metal. The infiltrated metal can comprise aluminum with added silicon and copper. In another version, the composite may comprise a different composition of a ceramic and metal, such as metal having dispersed ceramic particles; or the base plate 42 can be made from only a metal, such as stainless steel or aluminum.

The backside surface 25 of the baseplate 42 of the electrostatic chuck 20 comprises a raised central protrusion 52, which is surrounded by an annular trough 53, as for example shown in FIG. 1B. In the version shown, the raised central protrusion 52 is a D-shaped mesa having a contour that is formed by a circular portion comprising a three-quarter circle and ending in a flat line. The protrusion 52 is shaped and sized to match a corresponding cavity 55 in the pedestal 32, as shown in FIG. 2. In this version, the cavity 55 is also D-shaped to mate with the D-shaped mesa. The flat line portion of the protrusion 52 aligns with the straight line portion of the cavity 55. This allows the protrusion 52 and cavity 55 to serve as an alignment guide when the chuck 20 is positioned on the pedestal 32 in the chamber. The alignment guide reduces the possibility of damaging the chuck 20 by improperly positioning or locating the chuck 20 on the underlying pedestal 32 when moving or replacing the chuck 20 from the chamber in the fabrication lab.

In addition, the raised central portion also has three apertures 82, which are asymmetrically offset from one another, by the angle α (alpha) which is measured from a radial center 86 of the circular contour portion. The apertures 82 receive the electrode terminal posts 84 which are mounted in the cavity 55 of the pedestal 32. The apertures 82 also serve as a secondary alignment guide further ensuring placement accuracy when positioning the chuck 20 onto the pedestal 32. If the apertures 82 were symmetric, for example positioned exactly 120° apart from each other, the chuck 20 could be accidentally positioned on the pedestal 32 in one of three different orientations. Instead, the asymmetrically offsets apertures 82 ensure that the chuck 20 can only be positioned in one orientation over the pedestal 32. In one version, the offset angle α is from about 115 to about 135°, for example about 125°. Two of the apertures 82 are used to connect to electrode posts 84 that supply a voltage bias to the bipolar electrodes 24 to maintain an electrostatic charge in the electrodes. The third aperture 82 connects to an electrode post 84, which contacts the chuck 20 to a floating potential, which is used to adjust voltage applied through the other electrode posts 84.

In addition, the protrusions 52 also have a centrally positioned gas coupler 74 to receive a gas tube 72 that extends out of the cavity 55. The gas tube 72 provides a heat transfer gas, such as argon or helium, to the gas ports 31, which in turn supply the gas grooves 29, 37 and 39 to maintain a supply of heat transfer gas below the substrate 104 during processing. The heat transfer gas assists in exchanging heat between the substrate 104 and the chuck 20. A polished ring 89 encircles the gas coupler 74 to receive an O-ring, which sits in a groove in a pedestal 32 on which the chuck is mounted in a chamber. A second polished ring 91 is provided radially further outward at about the radial midpoint of the backside surface 25 of the chuck 20, to provide a seal around the heat transfer gas connections from the vacuum environment in the chamber. Yet another hole 92 is provided to allow insertion of a thermocouple, typically a k-type thermocouple into the hole 92 to contact the chuck 20.

In one version, the electrostatic puck 22 is attached to the base plate 42 by a bond 54 made from a metal foil, such as an aluminum foil, which diffusion bonds the base plate 42 and dielectric 26. The electrostatic chuck 20 having the puck 22, base plate 42 and bond 54 is an improvement over conventional supports because the chuck 20 can be easily removed from the pedestal 32 when replacement or refurbishment of one or more of the electrostatic puck 22 or its underlying base plate 42 is required. Because the exposed annular flange portion of the base plate 42 is not covered by the dielectric 26, the relatively strong annular metal flange 46 can be detachably connected to the pedestal 32 to allow for easy removal of the puck 22 and base plate 42. For example, the electrostatic puck 22 and base plate 20 can be detachably connected to the pedestal 32 by inserting connectors 44 through the composite material of the flange 46 and into the pedestal 32. The puck 22 and base plate 42 can then be removed from the pedestal 32 by removing the connector 44 from at least one of the base plate flange 46 and pedestal ledge 40, when one or more of the puck 22 and base plate 42 has become excessively eroded or dirtied with process residues. The "detachable" electrostatic chuck 20 reduces the costs associated with processing substrates with the electrostatic chuck 20 by allowing the electrostatic puck 22 and/or base plate 42 to be replaced or refurbished as needed, without requiring replacement of the entire electrostatic chuck 20.

The electrostatic chuck 20 is detachably mounted on a pedestal 32 in the chamber 106, to form the substrate support 10, as shown in FIGS. 2 and 3. The pedestal 32 comprises a housing 34 adapted to protect portions of the electrostatic chuck 20 from the process environment (FIG. 3). The housing 34 comprises sidewalls 38 and a bottom wall 78 that surround an interior enclosure 35 to protect components within the enclosure, such as for example electrical connectors, gas tubes and fluid conduits. The pedestal 32 further comprises a peripheral ledge 40 that extends outwardly from the top of the housing sidewall 38 to provide a projecting support for the electrostatic puck 22. The pedestal housing 34 can comprise a metal that is resistant to corrosion in the substrate processing environment, such as for example at least one of stainless steel or titanium. The pedestal 32 can also comprise a pedestal column 33 that extends between the housing 34 and the chamber 106. Electrical connectors, gas conduits and fluid conduits can be passed through the column 33 to protect them from the processing environment. A bellows 36 can also be provided to raise and lower the electrostatic puck 22 and substrate 104 in the chamber 106. Various grooves 83 and o-ring seals 85 are positioned around the gas and fluid conduits to form seals against the polished rings 89, 91 of the chuck 20. Please modify language as you see fit and add paragraph:

The electrostatic chuck 20 can further comprise other elements that improve substrate processing, such as for example, a thermocouple 80 having a temperature sensing end that is embedded in the electrostatic puck 22, as shown in FIG. 3. The thermocouple 80 can connect to a temperature monitor, such as a chamber controller 194, to monitor the temperature of the electrostatic chuck 20 and substrate 104 during processing (FIG. 5). The electrostatic chuck 20 can also comprise heat transfer gas outlets 76 on the surface 28 of the electrostatic puck 22 to deliver a heat transfer gas, such as nitrogen, to the backside of a substrate 104. The heat transfer gas outlets 76 can feed channels (not shown) formed on the support surface 28, and can be connected via a conduit 74 to a heat transfer gas supply 75. A gas tube 72 can be inserted into electrostatic puck 22 to define a path for the heat transfer gas through the puck 22, and to provide a desired flow of the heat transfer gas to the support surface 28.

In one version, the pedestal 32 further comprises a heat transfer plate 56 which contacts the backside surface 25 of the chuck 20 to transfer heat to or from the chuck 20 and overlying substrate 104 to maintain a desired substrate temperature. For example, the heat transfer plate 56 may comprise a heating or cooling plate. In the version shown, the heat transfer plate 56 can comprise at least one fluid channel 58 through which a heat transfer fluid can be flowed to control the temperature of the heat transfer plate 56. The heat transfer fluid is supplied by a fluid supply 57 connected to the fluid channel 58 via one or more conduits 61 routed through the column 33 of the pedestal 32. The heat exchange plate 56 contacts and desirably extends beneath a substantial portion of the substrate receiving surface 28, such as for example from at least about 25% to about 85% of the substrate receiving surface 28, to provide good heat exchange with the substrate 104. The heat transfer plate 56 is made of a thermally conductive material such as a metal, for example at least one of copper, stainless steel or aluminum.

In one version, the heat transfer plate 56 comprises improved fluid channels 58 that provide enhanced cooling/heating of the heat transfer plate 56. In the version shown in FIG. 4, the fluid channels 58 are embedded in the heat transfer plate to provide improved heating/cooling of the plate 56. The fluid channels 58 comprise a fluid inlet 64*a* that is located at an interior region 59 towards the center 73 of the plate 56, and that receives the heat transfer fluid from the connecting conduit 61. The fluid inlet 64*a* feeds a first spiral channel 58*a* that spirals outwardly from the fluid inlet 64*a* towards a periphery 63 of the heat transfer plate 56. The first spiral channel 58*a* desirably encircles the interior region 59 and center 73 more than once, such as at least about 3 times. A second spiral channel 58*b* connects to the first spiral channel 58*a* near the periphery of the plate 56, and runs adjacent to the first spiral channel part 58*a* to trace a second spiraling flow path back to a fluid outlet 64*b* that is towards the center 73 of the plate 56. Thus, the spiral channels 58*a,b* provide opposing spiral flows of the heat transfer fluid through the heat transfer plate 56. The spiral channels 58*a,b* also provide a substantially horizontal flow of fluid through the heat transfer plate 56 to extend to a larger region of the plate 56. The improved fluid flow channel configuration provides improved temperature control of the heat transfer plate 56 by thermally contacting a large area of the heat transfer plate 56.

In one version, the heat transfer plate 56 is formed by attaching first and second plate portions 62*a*, 62*b*. For example, the heat transfer plate 56 may comprise a first plate portion 62*a* comprising a first material, and a second plate portion 62*b* below the first plate portion 62*a* that comprises a second material. The first plate portion 62*a* may comprise a first material having good heat transfer qualities to transfer heat to the substrate 104, such as for example copper. The second plate portion 62*b* may comprise other beneficial characteristics, for example, the second plate part 62*b* may be a material that is strong, such as stainless steel. The first and second plate portions 62*a*, 62*b* can be joined together by a conventional bonding method, for example by heating the plate portions 62*a,b* to braze the portions together. The fluid flow channel 58 is desirably embedded in one or more of the plate portions 62*b*, and is preferably at least partially embedded in the first plate portion 62*a*. In one version, the fluid flow channel 58 is formed by machining or otherwise forming an open channel in the first plate portion 62*a*, and brazing the second plate portion 62*b* over the open channel to form the closed fluid flow channel 58.

A thermally conductive layer 60 can be provided between the base plate 42 and the heat transfer plate 56 to enhance heat exchange therebetween. The thermally conductive layer 60 conforms to the top surface 65 of the heat transfer plate 56 and the bottom surface 67 of the base plate 42. In one version, the thermally conductive layer 60 comprises an interstitial material layer such as graphite, as described for example in U.S. Pat. No. 6,563,686 to Tsai et al, filed on Mar. 19, 2001, and commonly assigned to Applied Materials, which is herein incorporated by reference in its entirety.

In one version, the heat transfer plate 56 and pedestal 32 are spring loaded with a spring mechanism 62 between the heat transfer plate 56 and the pedestal 32 to apply a pressure to press the heat transfer plate 56 against the backside surface 25 of the electrostatic chuck 20 to improve heat transfer therebetween. In the version shown in FIG. 3, the spring mechanism 62 comprises a plurality of vertically aligned springs 23 that are compressed between a bottom wall 66 of the pedestal housing 34 and the heat transfer plate 56. The springs 23 can be positioned at intervals along the bottom wall 66 to form one or more annular groupings of springs that apply pressure about a desired radius of the heat transfer plate 56. The spring-loaded pedestal 32 can further comprise a compression ring 68 that rests on top of the springs 23 and has a pressing surface 69 that presses against the heat transfer plate 56. The spring mechanism 62 desirably applies a force of at least about 200 to 400 lbs to the heat transfer plate 56 to improve heat transfer with the overlying chuck 20.

The pedestal 32 may also comprise springs in other areas, such as a plurality of gas tube springs 70 to support and stabilize the gas tube 72 in the portion of the gas conduit 74 formed in the electrostatic puck 22 and base plate 42. A plurality of springs 70 can be positioned in the cavity 55 of the pedestal 32 to press on a lower surface 78 of the gas tube 72 to secure the gas tube in the gas coupler 74. The springs 70 help stabilize the gas tube 72 during varying process temperatures and process conditions that could otherwise lead to misalignment of the gas tube 72 in the gas coupler 74.

An embodiment of an apparatus 102 comprising a substrate-processing chamber 106 suitable for processing a substrate 104 is shown in FIG. 5. The particular embodiment of the apparatus 102 shown herein is suitable for processing substrates 104, such as semiconductor wafers, and may be adapted by those of ordinary skill to process other substrates 104, such as flat panel displays, polymer panels or other electrical circuit receiving structures. The apparatus 102 is particularly useful for processing layers, such as etch resistant, silicon-containing, metal-containing, dielectric, and/or conductor layers on the substrate 104. The apparatus 102 may also be attached to a mainframe unit (not shown) that contains and provides electrical, plumbing, and other support functions for the apparatus 102 and may be part of a multichamber system (not shown).

Generally, the process chamber 106 comprises a wall 107, such as an enclosure wall 103, which may comprise a ceiling 118, sidewalls 114, and a bottom wall 116 that enclose a process zone 108. In operation, process gas is introduced into the chamber 106 through a gas supply 130 that includes a process gas source 138, and a gas distributor 137. The gas distributor 137 may comprise one or more conduits 136 having one or more gas flow valves 134 and one or more gas outlets 142 around a periphery of the substrate 104, which is held in the process zone 108 on the electrostatic chuck 20. Alternatively, the gas distributor 130 may comprise a showerhead gas distributor (not shown). Spent process gas and process byproducts are exhausted from the chamber 106 through an exhaust 144 which may include an exhaust port 170 that receives spent process gas from the process zone 108 and delivers the gas to an exhaust conduit 177, a throttle valve 135 to control the pressure of process gas in the chamber 106, and one or more exhaust pumps 152.

The process gas may be energized to process the substrate 104 by a gas energizer 154 that couples energy to the process gas in the process zone 108 of the chamber 106. For example, the gas energizer 154 may comprises process electrodes that may be powered by a power supply to energize the process gas. The process electrodes may include an electrode that is or is in a wall, such as a sidewall 114 or ceiling 118 of the chamber 106, which may be capacitively coupled to another electrode, such as the electrode 24 in the electrostatic chuck 20 below the substrate 104. Alternatively or additionally, the gas energizer 154 may comprise an antenna comprising one or more inductor coils, which may have a circular symmetry about the center of the chamber 106. In yet another version, the gas energizer 154 may comprise a microwave source and waveguide to activate the process gas by microwave energy in a remote zone (not shown) upstream from the chamber 106.

In one version, the chamber 106 comprises a physical vapor deposition chamber capable of sputter depositing material on a substrate 104. In this version, the chamber comprises a sputtering target 155 having material to be deposited on the substrate. The target 155 can be electrically biased with respect to another component in the chamber, such as a process shield, to act as a gas energizer 154 that energizes the process gas and sputters material from the target 155 and onto the substrate 104.

To process a substrate 104, the process chamber 106 is evacuated and maintained at a predetermined sub-atmospheric pressure. The substrate 104 is then provided on the electrostatic chuck 20 of the substrate support 10 by a substrate transport 101, such as for example a robot arm and a lift pin system. The gas supply 130 provides a process gas to the chamber 106 and the gas energizer 154 couples energy to the process gas to energize the gas and process the substrate 104, for example by etching material on the substrate or depositing material on the substrate 104. Similarly, to clean the chamber after processing of the substrate 104, the gas supply 130 provides a process gas comprising a cleaning gas to the chamber 106 and the gas energizer 154 energizes the cleaning gas to clean the chamber 106.

The chamber 106 is controlled by a controller 194 that comprises program code having instruction sets to operate components of the chamber 106 to process substrates 104 in the chamber 106. For example, the controller 194 can comprise a substrate positioning instruction set to operate one or more of the electrostatic chuck 20 and substrate transport to position a substrate 104 in the chamber 106, and to set a chucking voltage applied by the electrode power supply 81 to hold the substrate 104 on the electrostatic chuck 20; a gas flow control instruction set to operate the flow control valves 134 to set a flow of gas to the chamber 106; a gas pressure control instruction set to operate the exhaust throttle valve 135 to maintain a pressure in the chamber 106; a gas energizer control instruction set to operate the gas energizer 154 to set a gas energizing power level; a temperature control instruction set to control temperatures in the chamber 106, for example by controlling the supply of heat transfer fluid to the heat transfer plate 56, and the supply of heat transfer gas to the support surface 28; and a process monitoring instruction set to monitor the process in the chamber 106, for example by monitoring temperatures via the thermocouple 80.

Although exemplary embodiments of the present invention are shown and described, those of ordinary skill in the art may devise other embodiments which incorporate the present invention, and which are also within the scope of the present invention. For example, the electrostatic chuck 20 can be of other types, for example, a polymer dielectric layer covering a metal plate that serves as an electrode. Moreover, the chuck 20 can be attached to the pedestal by other means than the annular flange 46 and pedestal ledge 40, for example, a screwing thread on the backside of the chuck. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. An electrostatic chuck for attachment to a pedestal in a substrate processing chamber capable of processing a substrate in an energized process gas, the electrostatic chuck comprising:
   (a) at least one electrode capable of being charged to energize a process gas;
   (b) a dielectric covering the electrode;
   (c) a frontside surface to receive a substrate;
   (d) an annular flange; and
   (e) a backside surface comprising a central protrusion having asymmetrically offset orifices for receiving electrode terminal posts and a gas tube, wherein at least one orifice is offset from another orifice by an angle of from about 115 to about 135°.

2. A chuck according to claim 1 wherein the backside surface comprises an annular trough surrounding the central protrusion.

3. A chuck according to claim 1 wherein the central protrusion comprises a D-shaped mesa.

4. A chuck according to claim 1 wherein the angle is about 125°.

5. A chuck according to claim 1 wherein an orifice positioned at the center of the central protrusion comprises a gas port, and is surrounded by a first O-ring groove.

6. A chuck according to claim 5 comprising a second O-ring groove that extends around the central protrusion.

7. A chuck according to claim 5 wherein the dielectric comprises a ceramic having a pair of electrodes embedded therein, the ceramic being joined to a base plate comprising porous ceramic infiltrated with metal.

8. A substrate support comprising the electrostatic chuck of claim 1, and further comprising a pedestal to receive the electrostatic chuck, the pedestal comprising a cavity shaped to receive the central protrusion and a peripheral ledge to receive the annular flange.

9. An electrostatic chuck for attachment to a pedestal in a substrate processing chamber capable of processing a substrate in an energized process gas, the electrostatic chuck comprising:
   (a) at least one electrode capable of being charged to energize a process gas;
   (b) a dielectric covering the electrode;
   (c) a frontside surface to receive a substrate;
   (d) an annular flange; and
   (e) a backside surface comprising a D-shaped mesa surrounded by an annular trough, the D-shaped mesa comprising asymmetrically offset orifices that include at least one orifice that is offset from another orifice by an angle of from about 115 to about 135°.

10. A chuck according to claim 9 wherein the asymmetrically offset orifices are provided for receiving electrode terminal posts and a gas tube.

11. A chuck according to claim 9 wherein the dielectric comprises a ceramic having a pair of electrodes embedded therein, and wherein the ceramic is joined to a base plate comprising porous ceramic infiltrated with metal.

12. A substrate support for a substrate processing chamber capable of processing a substrate in an energized process gas, the support comprising:

(a) an electrostatic puck comprising a dielectric covering at least one electrode capable of being charged to energize a process gas and having a frontside surface to receive a substrate;

(b) a base plate attached to the electrostatic puck, the base plate comprising (i) a composite of porous ceramic and infiltrated metal, (ii) an annular flange extending beyond the periphery of the dielectric, and (iii) a backside surface comprising a central protrusion with a circular contour portion having a radial center, the central protrusion having asymmetrically offset orifices for receiving electrode terminal posts and a gas tube, the orifices being offset from one another by asymmetric angles which are measured from the radial center of the circular contour portion; and (c) a pedestal having a peripheral ledge capable of being attached to the annular flange of the base plate, and a cavity shaped to correspond to, and receive, the central protrusion of the base plate.

13. A support according to claim 12 wherein the asymmetrically offset orifices are offset from one another by an asymmetric angle of from about 115 to about 135°.

14. A support according to claim 12 wherein an orifice positioned at the center of the central protrusion comprises a gas port, and is surrounded by a first O-ring groove, and a second O-ring groove extends around the central protrusion.

15. A support according to claim 12 wherein the base plate is bonded to the electrostatic puck with a diffusion bonded metal.

16. A substrate support for a substrate processing chamber capable of processing a substrate in an energized process gas, the support comprising:

(a) an electrostatic chuck comprising:

(i) an electrostatic puck comprising a dielectric covering at least one electrode capable of being charged to energize a process gas and having a frontside surface to receive a substrate; and (ii) a base plate below the electrostatic puck, the base plate having an annular flange, and a backside surface comprising a central protrusion with a circular contour portion having a radial center, the central protrusion having asymmetrically offset orifices for receiving electrode terminal posts and a gas tube, the orifices being offset from one another by asymmetric angles which are measured from the radial center of the circular contour portion;

(b) a pedestal having a peripheral ledge to attach to the annular flange of the base plate of the electrostatic chuck; and (c) a spring loaded heat transfer plate on the pedestal to contact the electrostatic chuck, the heat transfer plate comprising (i) a fluid channel, (ii) a first plate comprising a first material, and (iii) a second plate comprising a second material that is a different material from the first material, the second plate positioned below the first plate.

17. A support according to claim 16 wherein the fluid channel comprises first and second spiral channels, the first spiral channel capable of having a flow of fluid therethrough that is substantially opposite in direction to a flow of fluid through the second spiral channel.

18. A support according to claim 16 wherein the heat transfer plate comprises a copper plate and the pedestal comprises a stainless steel plate.

19. A support according to claim 16 wherein the spring loaded heat transfer plate comprises a set of springs resting on the pedestal with a compression ring positioned over the springs.

20. A support according to claim 19 further comprising a thermally conductive layer between the heat transfer plate and base plate.

21. A support according to claim 16 further comprising a gas tube mounted in the pedestal, the gas tube comprising a plurality of springs to press the gas tube into a gas coupler on the base plate.

22. An electrostatic chuck for attachment to a pedestal in a substrate processing chamber capable of processing a substrate in an energized process gas, the pedestal having a groove, the electrostatic chuck comprising:

(a) at least one electrode capable of being charged to energize the process gas;
(b) a dielectric covering the electrode;
(c) a frontside surface to receive a substrate;
(d) an annular flange;
(e) a backside surface comprising a central protrusion having orifices for receiving electrode terminal posts and a gas coupler;
(f) a first polished ring encircling the gas coupler; and
(g) a second polished ring that is radially outward from the first polished ring, wherein the first and second polished rings receive an O-ring which sits in the groove in the pedestal in the chamber.

23. A chuck according to claim 22 wherein the second polished ring is located at about the radial midpoint of the backside surface.

24. A chuck according to claim 23 wherein the second polished ring provides a seal around the heat transfer gas connections from the vacuum environment in the chamber.

25. A chuck according to claim 22 wherein backside surface comprises an annular trough surrounding a central protrusion comprising a D-shaped mesa.

26. A chuck according to claim 22 wherein the orifices are asymmetrically offset from one another by an angle of from about 115 to about 135°.

27. A support according to claim 12 wherein the central protrusion of the backside surface of the back plate is surrounded by an annular trough.

28. A support according to claim 12 wherein the central protrusion of the backside surface of the back plate is a D-shaped mesa.

29. A support according to claim 16 wherein the first and second plates are joined together with a brazed bond.

30. A support according to claim 16 wherein the first and second materials are different from each other.

31. A support according to claim 16 wherein the first material comprises copper and the second material comprises stainless steel.

* * * * *